United States Patent [19]
Meline et al.

[11] Patent Number: 5,663,682
[45] Date of Patent: Sep. 2, 1997

[54] WIDE BANDWIDTH COMBINER-AMPLIFIER

[75] Inventors: Reuben W. Meline, Crystal; Jeffrey O. Brown, St. Paul, both of Minn.

[73] Assignee: ADC Telecommunications, Inc., Minneapolis, Minn.

[21] Appl. No.: 553,760

[22] Filed: Oct. 23, 1995

[51] Int. Cl.$^6$ ...................................................... H03F 3/68
[52] U.S. Cl. ............................................ 330/124 R; 330/84
[58] Field of Search ...................................... 330/84, 124 R, 330/147, 284, 295

[56] References Cited

U.S. PATENT DOCUMENTS 5,256,987  10/1993  Kibayashi et al. ...................... 330/295

*Primary Examiner*—Steven J. Mottola
*Attorney, Agent, or Firm*—Merchant, Gould, Smith, Edell, Welter & Schmidt, P.A.

[57] ABSTRACT

A combiner-amplifier is provided which has first current feedback amplifier which amplifies a first received signal by a predetermined gain value. A second current feedback amplifier amplifies a second received signal by the predetermined gain value. A combiner is operatively coupled to the first and the second current feedback amplifiers to combine the amplified first received signal with the second received signal together to generate a combined signal which is attenuated by the predetermined gain value such that the combined signal has approximately a unity gain over the first and the second received signals within a bandwidth of at least 45 megahertz.

18 Claims, 4 Drawing Sheets

WIDE BANDWIDTH COMBINER-AMPLIFIER

FIELD OF THE INVENTION

The present invention relates generally to a signal combiner. More particularly, the present invention relates to such a combiner exhibiting an overall unity gain by having an active amplifier circuit.

BACKGROUND OF THE INVENTION

The cable television (CATV) market place has used splitter/combiner products to manage video signal distribution since the industry began in the early 1950s. This first industrial application evolved into a consumer/residential application during the 1970s. Today, the delivery of video services is growing fast and deregulation of the CATV market is near. Furthermore, the bandwidth requirement is increasing with new modulator technology. New modulators are capable of 750–860 megahertz (MHz) signals rather than the 450 MHz output previously available.

Traditionally signals for CATV travel in the outbound direction from the headend or distribution point to the customer or home residences. However, with the advent of interactive CATV it is now necessary to pass signal both outbound and inbound (i.e. from the customer back to the headend). This can be accomplished by using different frequency bands on the same cable for inbound and outbound communication. But, this leads to needing a receiver at the headend for each customer. Such a requirement is not cost effective. Therefore, a need exists for a way to reduce the number of receivers needed at the headend.

The present invention provides a solution to this and other problems, and offers other advantages over the prior art.

SUMMARY OF THE INVENTION

The present invention relates to signal amplifiers and combiners that operate over a wide frequency bandwidth to combine signals from two or more customers into a combined multiplexed signal that can be routed on a communication channel to a receiver circuit at the headend.

In accordance with one aspect of the invention, a combiner-amplifier is provided which has first current feedback amplifier which amplifies a first received signal by a predetermined gain value. A second current feedback amplifier amplifies a second received signal by the predetermined gain value. A combiner is operatively coupled to the first and the second current feedback amplifiers to combine the amplified first received signal with the second received signal together to generate a combined signal which is attenuated by the predetermined gain value such that the combined signal has approximately a unity gain over the first and the second received signals within a bandwidth of at least 45 megahertz.

These and various other features as well as advantages which characterize the present invention will be apparent upon reading of the following detailed description and review of the associated drawings.

DETAILED DESCRIPTION

Figure 1:
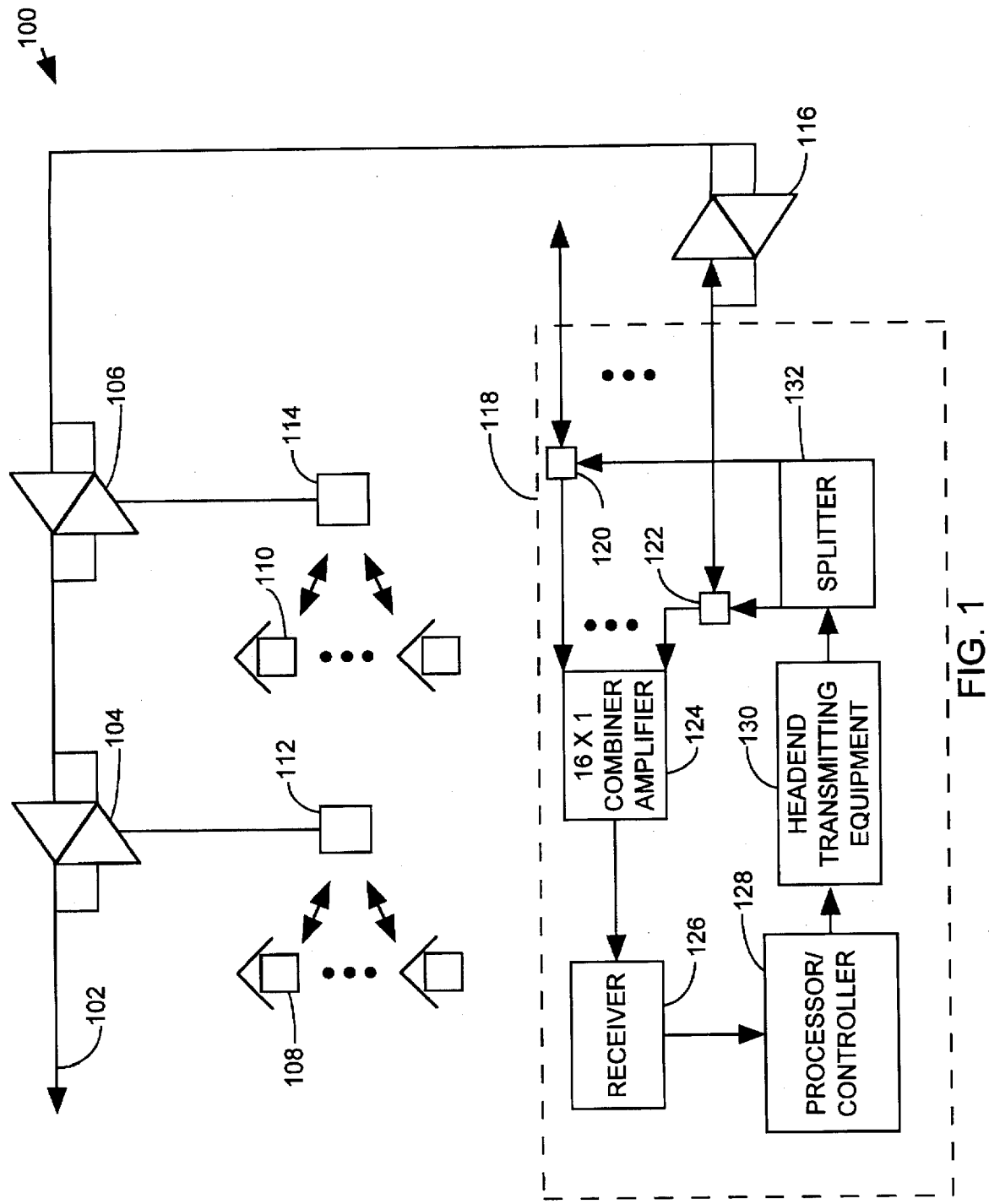
FIG. 1 is a block diagram of a signal communication system which utilizes one or more preferred embodiment combiner-amplifiers.

Referring now to FIG. 1, a CATV signal communication system 100 is shown. A typical CATV system, like the one shown in FIG. 1 includes several residences/customers 108, 110. One or more customers may be grouped together and split from a common tap. For example, a group of n customers 108 are split from an n-way tap 112. Similarly, a group of m customers 110 are split from an m-way tap 114. Each tap 112 and 114 are feed from a common node trunk line 102 through trunk amplifiers 104 and 106, respectively. The trunk amplifiers 104, 106 are placed at each signal split point to compensate for the loss of average signal power due to the signal splitting and potentially any line loss that has occurred between trunk amplifiers. The trunk line 102 extends through all of the branches and terminates at one end.

The other end of the trunk line 102 is connected to a final trunk amplifier 116 which in turn is connected to diplex filter 122 within the headend or distribution point 118 The diplex filter 122 is a bi-directional device which splits off the inbound signals to the headend 118 and sends them to an input of the combiner-amplifier 124. The inbound signals may be present within the 5 to 50 or 200 MHz frequency band and as such the combiner-amplifier 124 should be able to simultaneously combine signals within this wide bandwidth. The combiner-amplifier 124 combines inbound signals from sixteen different nodes attached through diplex filter 120, 122 into a combined signal. The combined signal is received by a receiver 126 which in turn provided all or part of the combined signal to a processor/controller 128 which controls operations of the headend 118. The processor/controller 128 also controls operations of the headend transmitting equipment 130 which supplies outbound signals to a headend splitter 132. The headend splitter 132 splits the outbound signal among several diplex filter 120, 122 which add the outbound signals to the trunk line 102 and forwards those signals to the customers. The outbound signal for CATV systems is typically a wide bandwidth composite signal between 50 or 200 and 750 MHz.

Figure 2:
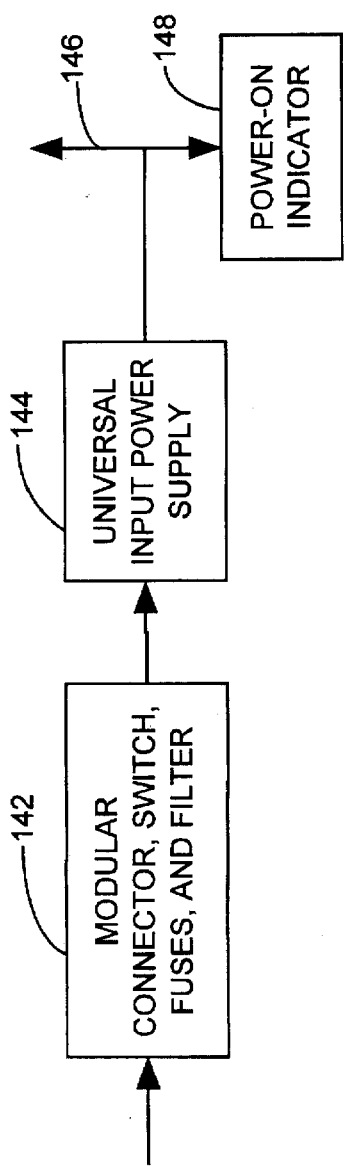
FIG. 2 is a block diagram of a preferred embodiment power supply.
Figure 3:
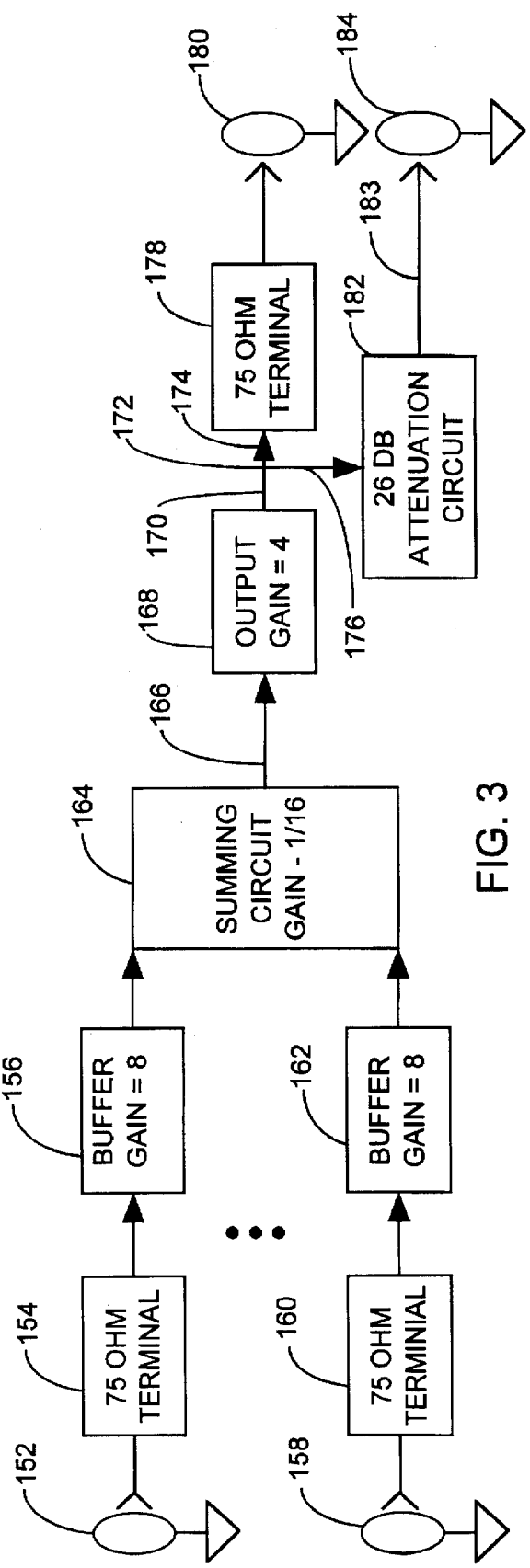
FIG. 3 is a block diagram of a preferred embodiment combiner-amplifier.

The present invention can be summarized in reference to FIGS. 2 and 3 which are block diagrams of the preferred embodiment object combiner-amplifier 124. The combiner-amplifier includes sixteen inputs (e.g., a combination of input jack 152 and a 75 ohm terminator terminal 154). Each of the inputs receives a different received video signal from an external source through one of the 16 "F"-style connectors. These are 75 ohm impedance connectors.

Sixteen current feedback amplifiers (e.g., buffer 156) are operatively coupled to an associated input (e.g., terminal 154), respectively. Each of the feedback amplifiers amplifies the received signal from the associated input by a gain of 8 times the average signal voltage.

A combiner is operatively coupled to each of the sixteen current feedback amplifiers. This combiner combines each of the amplified received signals together to generate a combined signal which is attenuated by 8 times the average signal voltage such that the combined signal has approximately a unity gain over the received signals within a bandwidth of at least 45 megahertz. An output (i.e., a combination of output jack 180 and a 75 ohm terminator terminal 178) is operatively coupled to the combiner which provides the combined signal to a device external to the combiner-amplifier 124. The terminator terminal 178 may be implemented as a series connected 75 ohm resister to a "F"-style connector which properly terminates the output of the combiner-amplifier 124.

The combiner-amplifier 124 preferably utilizes components arranged in a particular circuit design (i.e., the sixteen inputs, the sixteen current feedback amplifiers, the combiner, and the output) which can manipulate signals between 5 megahertz and 200 megahertz such that the output passes signals within the 5 megahertz to 200 megahertz frequency band from the inputs with approximately a unity gain of average signal voltage over the frequency band.

The combiner preferably includes a current feedback amplifier-based summing circuit 164 which sums the amplified received signals together to form an intermediate signal 170. A signal splitter 172 is operatively coupled to an output 168 of the summing circuit 164 which splits the intermediate signal 170 into the combined signal 174 and an output monitoring signal 176. An attenuator circuit 182 is operatively coupled to the signal splitter 172 to attenuate an average signal power of the output monitoring signal 176 by at least 26 decibels (dB) over an average signal power of the combined signal 174. This attenuated output monitoring signal 183 is provided to output jack 184.

The summing circuit 164 attenuates by approximately 16 times an average signal voltage of each amplified received signal (e.g. from amplifier 156) to an summed signal 166 which has an average signal voltage equal to 1/16th of each amplified received signals. Subsequently, this signal 166 is amplified (e.g., with another current feedback amplifier 168) by approximately 4 times an average signal voltage to form the intermediate signal 170. The signal splitter 172 then equally divides the average signal voltage of the intermediate signal 170 between the combined signal 174 and the output monitoring signal 176.

The combiner-amplifier preferably includes a power supply 144, shown in FIG. 2, which provides a voltage source 146 to active circuitry in the sixteen current feedback amplifiers (e.g., buffer 156) and the combiner (e.g., output amplifier 168). This power supply 144 preferably is universal-type such that any voltage from 100 Volts Alternating Current (VAC) up to 250 VAC and 50 to 60 Hertz, may be supplied at the power supply connector. An indicator 148 is operatively coupled to the power supply 144 which indicates when the power supply 144 is activated. For example, this indicator may be an light emitting diode that is illuminated when the power supply 144 is activated.

One of the advantages of the combiner-amplifier 124 over other types of designs is the use of operational amplifiers to eliminate the need for transformers or inductors which typically inject interference into the signal being communicated on the trunk line 102. Such interference may take the form of cross talk and return loss. These types of interference are minimized in the active combiner-amplifier described in the preferred embodiment. In addition, the combiner-amplifier 124 is a an active (i.e., powered) unity gain combiner and as such has zero insertion loss when placed into the CATV system 100. This is significantly better than the passive combiners which may introduce a signal loss of 8 to 16 dB upon insertion into the CATV system.

Figure 4:
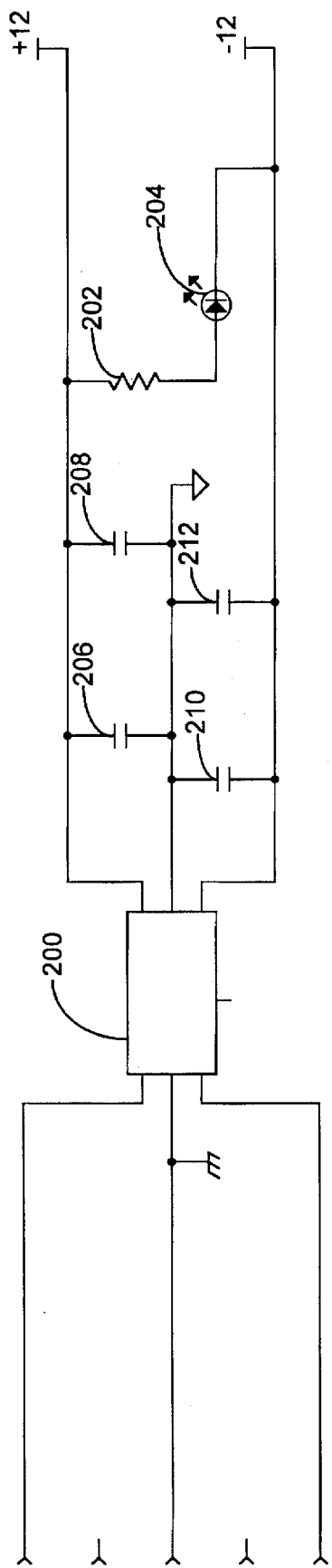
FIG. 4 is a circuit diagram of the preferred embodiment power supply shown in FIG. 2.
Figure 5:
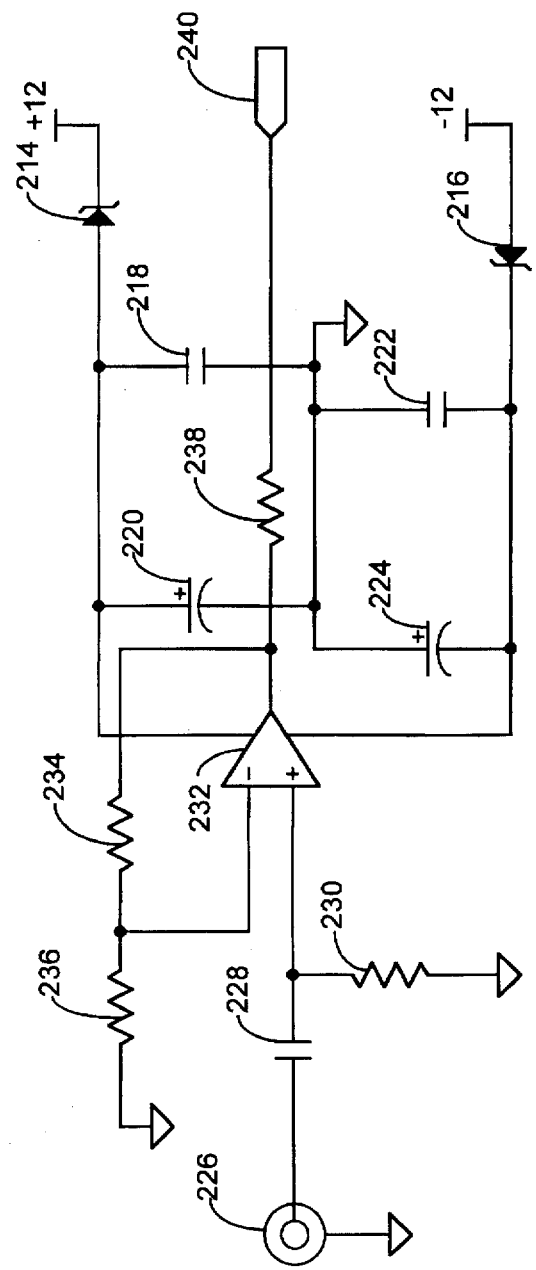
FIG. 5 is a circuit diagram of the input and buffer portion of the preferred embodiment combiner-amplifier shown in FIG. 3.
Figure 6:
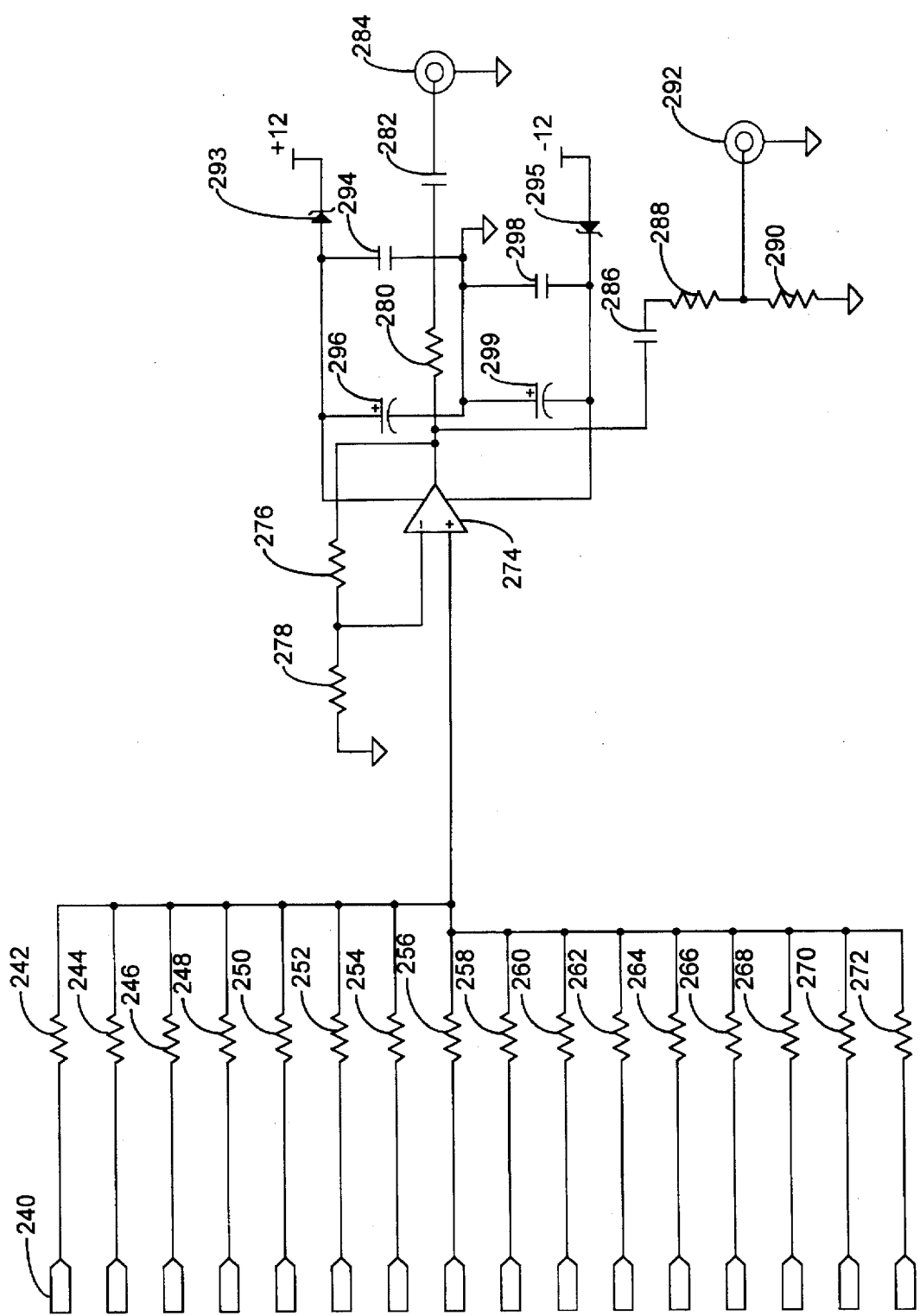
FIG. 6 is a circuit diagram of the summing circuit, output amplifier, and output portion of the preferred embodiment combiner-amplifier shown in FIG. 3.

The following discussion is directed to the detailed circuit diagrams shown in FIGS. 4, 5 and 6. The following definitions in Table 1 may be helpful in understanding this description:

TABLE 1

| | |
|---|---|
| Baseband Video | The standard composite video signal comprising all video information, synchronizing pulses, and audio information. It spans the frequency range of 0 to 6 MHz. |
| Cable TV signal | Covers the frequency range of approximately 54 to 552 MHz. |
| F connector | The standard 75 ohm coax connector used in homes and businesses to interconnect video and RF signals. The center conductor is the physical center conductor wire of the coax cable, and the shell is threaded. |
| Head-End | The central location where the cable TV signal is assembled, amplified, and distributed from the cable TV operator to the customer. |
| NAB | National Association of Broadcasters |
| NTSC | National Television Standards Committee, the committee that governs the color system compatible with black-and-white television. |
| SCTE | Society of Cable and Telecommunications Engineers |
| SMPTE | Society of Motion Picture and Television Engineers |
| Sub-split | Refers to the return signal from the customer to the head-end. The customer set-top boxes are not available to provide this signal yet, but the cable TV companies have either installed or are in the process of installing onto the cable system the equipment required to handle this signal. |
| Sub-split signal | Covers a relatively small frequency range but a band from 5 MHz to 50 MHz (or up to 200 MHz for some requirements) has been set aside for this return signal (from the customer to the head-end). |

Power to the on-board circuitry is provided by a high-efficiency Universal Input-to-DC converter 200 shown in FIG. 4. A green LED 204 in series with a 2100 ohm resistor 202 is connected across the output of the Universal Input-to-DC converter 200 to indicate when the combiner-amplifier is operating. Capacitors 206 and 208 are used as filters to reduce the alternating current (AC) characteristics of the positive side of the 12 volt power supply. In the preferred embodiment these capacitors 206, 208 were chosen as a 2.2 microfarad (μF) 50 volt (V) capacitor and a 4300 picofarad (pF) 50 V capacitor, respectively. Similarly, capacitors 210 and 212 are used as filters to reduce the alternating current (AC) characteristics of the negative side of the 12 volt power supply. In the preferred embodiment these capacitors 210, 212 were chosen as a 2.2 microfarad (μF) 50 volt (V) capacitor and a 4300 picofarad (pF) 50 V capacitor, respectively.

Each operational amplifier (op-amp) in the combiner-amplifier requires +5 and −5 VDC at its power leads. The power supply output is +12 and −12 VDC, so 6.8 volt zener diodes (e.g., zener diodes 214, 216 as shown in FIG. 5 for one of the 16 input branches 152, 154, 156 as shown and described in reference to FIG. 3) are connected in series with the power supply lines at every op-amp to drop the voltage to the proper level. Each op-amp power supply lead is bypassed to common by two capacitors (e.g., capacitors 218, 220). One of them is a 0.1 μF ceramic capacitor (e.g., capacitor 218), the other is a 10 μF tantalum capacitor (e.g., capacitor 220). This provides a good combination of bypassing at low and high frequencies. The 0.1 µF capacitor is preferably placed as close as possible to the op-amp power pin for good high-frequency bypassing.

Each input 226 is DC blocked with a 0.1 µF capacitor 228, then terminated with a 75 ohm resistor 230 to ground. The input signal then connects to the positive input of a very high bandwidth op-amp 232. These are current-feedback type op-amps, and are connected to provide a non-inverting gain of eight using a 475 ohm resistor 234 in the feedback loop, and a 68.1 ohm resistor 236 from the minus input to common. The ratio of the values for these resistors 234 to 236 should be 7 to 1, but the particular values are trivial except that they need to be chosen to obtain a particular desired rolloff or voltage peak point. The output of the op-amp connects to a 75 ohm resistor 238, the other side of which connects to a transmission line 240.

Transmission line 240 carries the signal to a 64.9 ohm resistor (e.g., resistor 242) which is one of the 16 inputs of the summing amplifier circuit portion of the combiner-amplifier as shown in FIG. 3. The other side of the resistor 242 connects to 64.9 ohm resistors 244 through 272 from the outputs of the other 15 op-amps as well, so that the total resistance at the end of the signal line looks like 75 ohms.

The signals at the positive input of the output op-amp are attenuated by the resistor network by a factor of 16. That, in combination with the attenuation by a factor of 2 at the output jack, is why the signal must be amplified by a factor of 32. All 16 signals are combined at the positive input of the output op-amp 274, and are amplified by a factor of 4. Since this op-amp is also a current-feedback type, the feedback resistor 276 is only 150 ohms, with a 49.9 ohm resistor 278 connected from the minus input to common. As noted before the 3 to 1 ratio of the resistors is critical, but the particular values may vary depending on the particular desired amplifier characteristics. The output pin connects to a 75 ohm resistor 280, which connects to a 0.1 µF DC-blocking capacitor, which then connects to the output jack 284. The monitor output also comes from the output pin, through a 0.1 µF DC-blocking capacitor 286, to a 750 ohm resistor 288, which connects to an 82.5 ohm resistor 290. This forms a 26 dB voltage divider connecting to the monitor jack. These resistor values were chosen so that, looking from the monitor jack back into the circuit, the impedance will be 75 ohms.

With these particular values for the various components, the electrical operating characteristics for the preferred embodiment unity gain combiner-amplifier (UGC) are shown in Table 2.

TABLE 2

| | | | | |
|---|---|---|---|---|
| Power Input-Voltage to 16 × 1 UGC | 100 to 260 VAC 110 to 340 VDC | 105 to 250 VAC 110 to 340 VDC | 110 to 240 VAC 120 to 320 VDC | Comments |
| Power Input Frequency to 16 × 1 UGC | 45 to 65 Hz. | 46 to 64 Hz. | 47 to 63 Hz. | |
| Power Input current to 16 × 1 UGC at 110 VAC | 50 mA max. | 75 mA max. | 100 mA max. | worst case |
| Internal regulated voltages on 16 × 1 UGC | +12.0 V ± 0.5 V −12.0 V ± 0.5 V | +12.0 V + 0.75 V −12.0 V + 0.75 V | N/A N/A | 100 mA load typical 100 mA load typical |
| Input Impedance | 75 ± 1.0 ohms | 75 ± 1.0 ohms | 75 ± 1.3 ohms | |
| Return Loss at the Inputs | >20 dB | >20 dB | >20 dB | From 5 MHz to 200 MHz |
| Output Impedance | 75 ± 1.0 ohms | 75 ± 1.0 ohms | 75 ± 1.3 ohms | |
| Max. signal input level | 33 dBmV | 33 dBmV | 30 dBmV | 0 dBmV = 1 mV into 75 ohm impedance |
| Max. signal output level | 57 dBmV | 57 dBmV | 54 dBmV | 0 dBmV = 1 mV into 75 ohm impedance |
| Second Harmonic distortion | −60 dBc | −60 dBc | −55 dBc | @ 30 MHz, 30 dBmV signal input |
| Third Harmonic distortion | −70 dBc | −70 dBc | −60 dBc | @ 30 MHz, 30 dBmV signal input |
| Signal isolation, input to input, output to input | >50 db | >50 db | >45 db | From 5 MHz to 200 MHz, 30 dBmV input |
| Gain Flatness | ± .8 dB | ± .8 dB | ± 1 dB | 5 MHz to 200 MHz |

TABLE 2-continued

| | | | | |
|---|---|---|---|---|
| Insertion Loss | 0 dB ± 1 dB | 0 dB ± 1 dB | 0 dB ± 1.2 dB | 5 MHz to 200 MHz |
| Carrier-to-Noise Ratio | 48 dB minimum | 48 dB minimum | 45 dB minimum | Carrier level is 20 dBmV Noise measured over a 4 MHz bandwidth over the range of 5 to 200 MHz |
| Monitor jack level | 20 dB ± 1 dB down from main output | same | ame | 5 MHz to 200 MHZ |

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the actual values of the circuit components (e.g., capacitors, resistors, diodes, etc.) may vary depending on the particular application for the combiner-amplifier while maintaining substantially the same functionality without departing from the scope and spirit of the present invention. In addition, although the preferred embodiment described herein is directed to a combiner-amplifier for a CATV system, it will be appreciated by those skilled in the art that the teachings of the present invention can be applied to other communication systems, like fiber optic networks, without departing from the scope and spirit of the present invention. Further, a −48 volts direct current (VDC) powered version of the combiner-amplifier 124 also may be produced. Furthermore, another embodiment of the combiner-amplifier may have an 8 input, 4 parallel output device that uses BNC connectors instead of "F"-type connectors for the video input and output jacks.

What is claimed is:

1. A combiner-amplifier, comprising:
   (a) first feedback amplifier means for amplifying a first received signal by a predetermined gain value;
   (b) second feedback amplifier means for amplifying a second received signal by the predetermined gain value; and
   (c) combiner means, operatively coupled to the first and the second feedback amplifier means, for combining the amplified first received signal with the second received signal by utilizing a feedback amplifier-based summing circuit to generate a combined signal which is attenuated by the predetermined gain value such that the combined signal has approximately a unity gain over the first and the second received signals within a bandwidth of at least 45 megahertz.

2. The combiner-amplifier of claim 1 wherein the first feedback amplifier means, the second feedback amplifier means, and the combiner means each manipulate signals between 5 megahertz and 200 megahertz such that the combined signal passes signals within the 5 megahertz to 200 megahertz frequency band from the first and the second received signals with approximately a unity gain over the frequency band.

3. The combiner-amplifier of claim 1 wherein the combiner means feedback amplifier-based summing circuit sums the first and the second amplified received signals together to form an intermediate signal.

4. The combiner-amplifier of claim 3 wherein the combiner means further comprises a signal splitter, operatively coupled to an output of the summing circuit which splits the intermediate signal into the combined signal and an output monitoring signal.

5. The combiner-amplifier of claim 4 wherein the combiner means further comprises an attenuator circuit, operatively coupled to the signal splitter, which attenuates an average signal voltage of the output monitoring signal by at least 20 decibels over an average signal voltage of the combined signal.

6. The combiner-amplifier of claim 5 further comprising a third through sixteenth feedback amplifier means which amplify an associated received signal with a predetermined gain value, respectively.

7. The combiner-amplifier of claim 6 wherein the predetermined gain value is a gain of 8 such that each amplifier means amplifies by approximately 8 times an average signal voltage of an associated received signal and the combiner means attenuates by approximately 8 times an average signal voltage of the combined signal, the summing circuit attenuating by approximately 16 times an average signal voltage of each amplified received signal and subsequently amplifying by approximately 4 times an average signal voltage to form the intermediate signal, the signal splitter equally dividing the average signal voltage of the intermediate signal between the combined signal and the output monitoring signal.

8. The combiner-amplifier of claim 1 further comprising a power supply which provides a voltage source to active circuitry in the first feedback amplifier means, the second feedback amplifier means, and the combiner means.

9. The combiner-amplifier of claim 8 further comprising an indicator, operatively coupled to the power supply, which indicates when the power supply is activated.

10. A combiner-amplifier, comprising:
   (a) a first input which received a first signal;
   (b) a second input which received a second signal;
   (c) a first current feedback amplifier, operatively coupled to the first input, which amplifies the first received signal by a predetermined gain value;
   (d) a second current feedback amplifier, operatively coupled to the second input, which amplifies the second received signal by the predetermined gain value;

(e) a combiner, operatively coupled to the first and the second current feedback amplifier, which combines the amplified first received signal with the second received signal by utilizing a feedback amplifier-based summing circuit to generate a combined signal which is attenuated by the predetermined gain value such that the combined signal has approximately a unity gain over the first and the second received signals within a bandwidth of at least 45 megahertz; and (f) an output, operatively coupled to the combiner, which provides the combined signal.

11. The combiner-amplifier of claim 10 wherein the first input, the second input, the first current feedback amplifier, the second current feedback amplifier, the combiner, and the output each manipulate signals between 5 megahertz and 200 megahertz such that the output passes signals within the 5 megahertz to 200 megahertz frequency band from the first and the second inputs with approximately a unity gain over the frequency band.

12. The combiner-amplifier of claim 11 wherein:

(a) the feedback amplifier-based summing circuit includes a current feedback amplifier which sums the first and the second amplified received signals together to form an intermediate signal;

(b) the combiner comprises a signal splitter, operatively coupled to an output of the summing circuit which splits the intermediate signal into the combined signal and an output monitoring signal; and (c) the combiner comprises an attenuator circuit, operatively coupled to the signal splitter, which attenuates an average signal voltage of the output monitoring signal by at least 20 decibels over an average signal voltage of the combined signal.

13. A combiner-amplifier, comprising:

(a) sixteen inputs, each input receiving a different received signal;

(b) sixteen current feedback amplifiers, operatively coupled to an associated input, respectively, each feedback amplifier amplifying the received signal from the associated input by a gain of 8 times;

(c) a combiner, operatively coupled to each of the sixteen current feedback amplifiers, which combines each of the amplified received signals together by utilizing a current feedback amplifier-based summing circuit to generate a combined signal which is attenuated by 8 times such that the combined signal has approximately a unity gain over the received signals within a bandwidth of at least 45 megahertz; and (d) an output, operatively coupled to the combiner, which provides the combined signal.

14. The combiner-amplifier of claim 13 wherein the sixteen inputs, the sixteen current feedback amplifiers, the combiner, and the output each manipulate signals between 5 megahertz and 200 megahertz such that the output passes signals within the 5 megahertz to 200 megahertz frequency band from the inputs with approximately a unity gain over the frequency band.

15. The combiner-amplifier of claim 13 wherein:

(a) the current feedback amplifier-based summing circuit sums the amplified received signals together to form an intermediate signal;

(b) the combiner comprises a signal splitter, operatively coupled to an output of the summing circuit which splits the intermediate signal into the combined signal and an output monitoring signal; and (c) the combiner comprises an attenuator circuit, operatively coupled to the signal splitter, which attenuates an average signal voltage of the output monitoring signal by at least 20 decibels over an average signal voltage of the combined signal.

16. The combiner-amplifier of claim 15 wherein the summing circuit attenuates by approximately 16 times an average signal voltage of each amplified received signal and subsequently amplifies by approximately 4 times an average signal voltage to form the intermediate signal, and the signal splitter equally dividing the average signal voltage of the intermediate signal between the combined signal and the output monitoring signal.

17. The combiner-amplifier of claim 13 further comprising a power supply which provides a voltage source to active circuitry in the sixteen current feedback amplifiers and the combiner.

18. The combiner-amplifier of claim 17 further comprising an indicator, operatively coupled to the power supply, which indicates when the power supply is activated.

* * * * *